United States Patent
Koizumi

(10) Patent No.: US 9,904,179 B2
(45) Date of Patent: Feb. 27, 2018

(54) EXPOSURE APPARATUS AND ARTICLE MANUFACTURING METHOD

(71) Applicant: CANON KABUSHIKI KAISHA, Tokyo (JP)

(72) Inventor: Ryo Koizumi, Saitama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/350,688

(22) Filed: Nov. 14, 2016

(65) Prior Publication Data

US 2017/0139332 A1    May 18, 2017

(30) Foreign Application Priority Data

Nov. 16, 2015   (JP) .................................. 2015-224228

(51) Int. Cl.
G03F 7/20   (2006.01)

(52) U.S. Cl.
CPC ...... *G03F 7/70433* (2013.01); *G03F 7/70425* (2013.01); *G03F 7/70466* (2013.01); *G03F 7/70475* (2013.01); *G03F 7/70483* (2013.01); *G03F 7/70525* (2013.01); *G03F 7/70725* (2013.01)

(58) Field of Classification Search
CPC ............ G03F 7/70425; G03F 7/70433; G03F 7/70475; G03F 7/70483
See application file for complete search history.

(56) References Cited

U.S. PATENT DOCUMENTS

| 6,542,237 B1* | 4/2003 | Kyoh | G03F 9/7003 356/401 |
| 2010/0104960 A1* | 4/2010 | Koga | G03F 9/7003 430/30 |

FOREIGN PATENT DOCUMENTS

| JP | 09007919 A | 1/1997 |
| JP | 11195598 A | 7/1999 |
| JP | 3278303 B2 | 4/2002 |

* cited by examiner

*Primary Examiner* — Michelle M Iacoletti
(74) *Attorney, Agent, or Firm* — Rossi, Kimms & McDowell LLP

(57) ABSTRACT

This invention provides an exposure apparatus for exposing each of a plurality of shot regions on a substrate. The exposure apparatus includes a control unit configured to control exposure processing of exposing each of the plurality of shot regions on the substrate using control information for controlling shapes of the shot regions exposed on the substrate such that the plurality of shot regions are adjacent to each other. The control information includes correction information for correcting, based on layout information of a plurality of shots adjacent to each other, a shift of adjacent portions of the plurality of shot regions caused by a distortion of the shapes of the plurality of shot regions. The control unit controls the exposure processing using the correction information.

9 Claims, 7 Drawing Sheets

BEFORE CORRECTION / AFTER CORRECTION

BEFORE CORRECTION / AFTER CORRECTION

| SHOT REGION | POSITION | X [nm] | Y [nm] | ΔX [nm] | ΔY [nm] |
|---|---|---|---|---|---|
| A | UPPER LEFT | -13 | 10 | -5 | 3 |
| A | UPPER RIGHT | 13 | 10 | 4 | 2 |
| A | LOWER LEFT | -13 | -10 | -5 | 7 |
| A | LOWER RIGHT | 13 | -10 | 5 | -1 |
| B | UPPER LEFT | -13 | -10 | -2 | -4 |
| B | UPPER RIGHT | 13 | -10 | 0 | 6 |
| B | LOWER LEFT | -13 | -30 | -2 | -1 |
| B | LOWER RIGHT | 13 | -30 | 0 | -2 |

EXPOSURE APPARATUS AND ARTICLE MANUFACTURING METHOD

BACKGROUND OF THE INVENTION

Field of the Invention

The present invention relates to an exposure apparatus and an article manufacturing method.

Description of the Related Art

There exists a technique of reducing an overlay error when performing, for a plurality of adjacent shot regions formed by first exposure, second exposure using shot regions including the joints of the plurality of shot regions.

Japanese Patent Laid-Open No. 09-007919 discloses a method of detecting an arrangement error in first exposure and correcting a shot region rotation component (6 in FIG. 2) in second exposure so as to reduce an overlay error.

The method disclosed in Japanese Patent Laid-Open No. 09-007919 can reduce the overlay error on the whole shot regions on average. However, as for the joints between the shot regions, it cannot be said that the overlay error can sufficiently be corrected. When forming one device from a plurality of shot regions, the overlay error on the joints between the plurality of shot regions needs to be further reduced.

SUMMARY OF THE INVENTION

The present invention provides, for example, a technique advantageous in reducing an overlay error on joints between a plurality of shot regions.

According to one aspect of the present invention, an exposure apparatus for exposing each of a plurality of shot regions on a substrate is provided. The apparatus comprises a control unit configured to control exposure processing of exposing each of the plurality of shot regions on the substrate using control information for controlling shapes of the shot regions exposed on the substrate such that the plurality of shot regions are adjacent to each other, wherein the control information includes correction information for correcting, based on layout information of a plurality of shots adjacent to each other, a shift of adjacent portions of the plurality of shot regions caused by a distortion of the shapes of the plurality of shot regions when exposing each of the plurality of shot regions, and the control unit controls the exposure processing using the correction information.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings. Note that the present invention is not limited to the following embodiments, and the following embodiments indicate merely detailed examples advantageous in implementing the present invention. In addition, not all the combinations of features described in the embodiments are essential to the solving means of the present invention.

Figure 1:
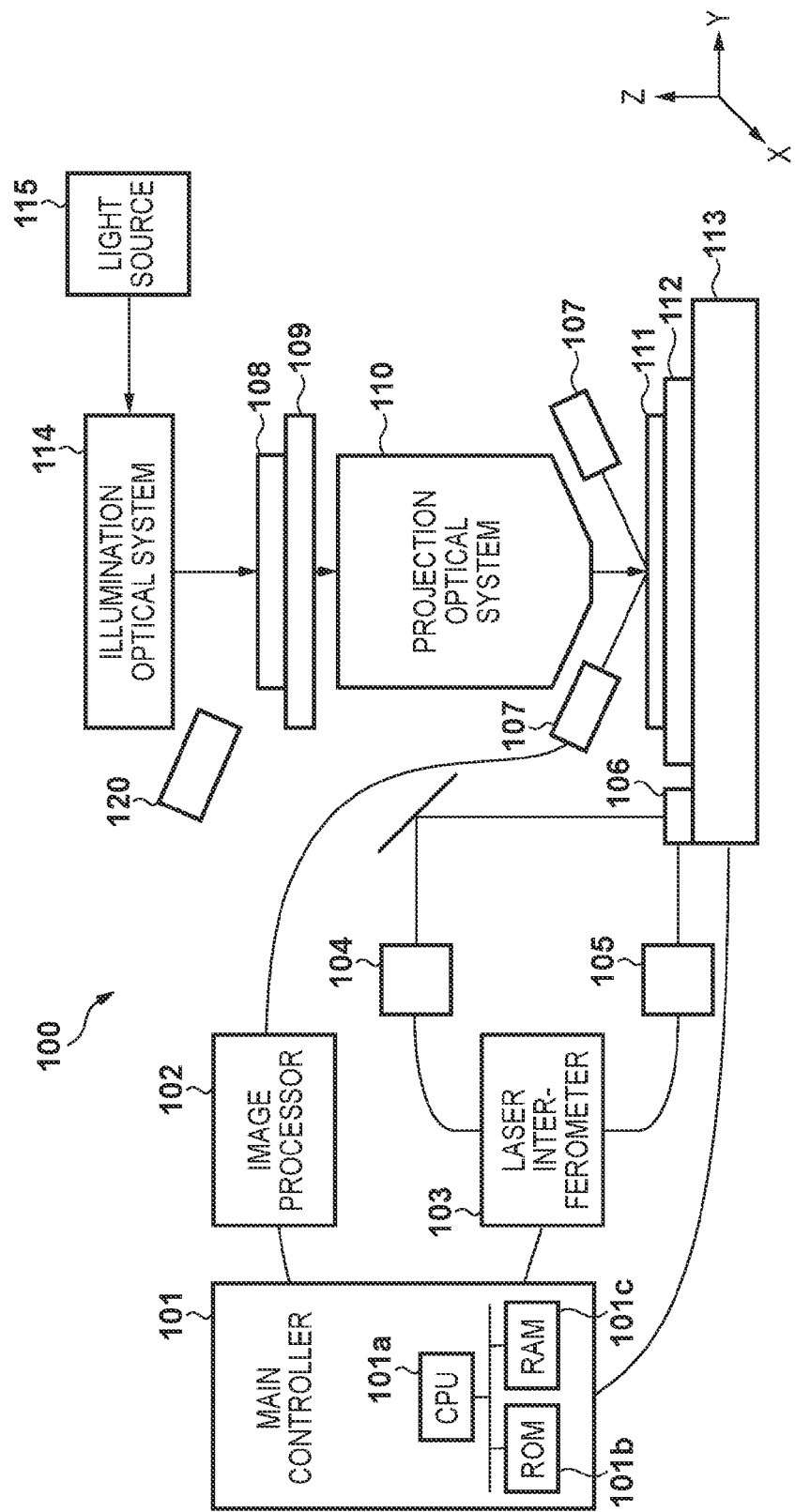
FIG. 1 is a view showing the arrangement of an exposure apparatus according to the embodiment.

FIG. 1 is a view showing the arrangement of an exposure apparatus 100 according to the embodiment. In the exposure apparatus 100, an original stage 109 holds an original 108 (mask or reticle). An illumination optical system 114 irradiates the original 108 held by the original stage 109 with light of a light source 115. A projection optical system 110 projects the light transmitted through the original 108 onto a substrate 111 (wafer). At this time, the substrate 111 is held by a substrate holder 112. The substrate holder 112 is supported by a substrate stage 113 configured to be movable.

The substrate stage 113 includes a six-axis drive mechanism with, for example, X, Y, Z, ωX, ωY, and ωZ axes, and is driven based on instruction values from a main controller 101. The current position of the substrate stage 113 is obtained by measuring, by a laser interferometer 103, reflected light of light beams from laser heads 104 and 105 with which a mirror 106 on the substrate stage is irradiated and converting the light into a posture amount. The main controller 101 obtains the current position of the substrate stage 113 from the laser interferometer 103, generates new drive instruction values, and feeds back the values, thereby maintaining the posture of the substrate stage 113.

A pair of focus sensors 107 are placed in the Y-axis direction so as to sandwich the vicinity of the exit portion of the projection optical system 110. Following scan exposure, one focus sensor irradiates the substrate 111 with oblique incident light at a predetermined pitch, and the other focus sensor receives the reflected light. Next, an image processor 102 converts the received light amount into a Z displacement amount, and the main controller 101 calculates an approximate plane based on the Z displacement amount of each point in the region. The drive instruction values of the Z, ωX, and ωY axes of the substrate stage 113 are changed so as to align the surface of the substrate 111 with the image of the original 108 projected via the projection optical system 110.

An alignment measuring unit 120 measures the relative positional shift between the original 108 and the substrate 111. The alignment measuring unit 120 can measure the coordinates of predetermined positions of each of a plurality of shot regions. In this embodiment, alignment marks are formed, for example, at predetermined positions (for example, five points at the four corners and the center) of each shot region.

The main controller 101 is a controller that generally controls the units of the exposure apparatus 100, and includes, for example, a CPU 101a, a ROM 101b that holds a control program and permanent data, and a RAM 101c that serves as the work area of the CPU 101a and holds temporary data. The main controller 101 according to this embodiment also functions as a correction unit (obtaining unit) that corrects control information (for example, shot layout information, projection magnification, scan direction, and the like) concerning exposure, thereby generating (obtaining) correction control information.

The exposure apparatus 100 according to this embodiment is a scan exposure apparatus that performs exposure while relatively driving an original and a substrate. In the manufacture of a semiconductor device, generally, a plurality of layers to form a pattern are aligned and overlaid on the substrate. That is, an exposure step is executed so as to overlay, on a first layer with a pattern formed on the substrate by first exposure, a second layer with a pattern formed by second exposure. The exposure apparatus 100 according to this embodiment can execute at least first exposure in the exposure step.

Figure 2:
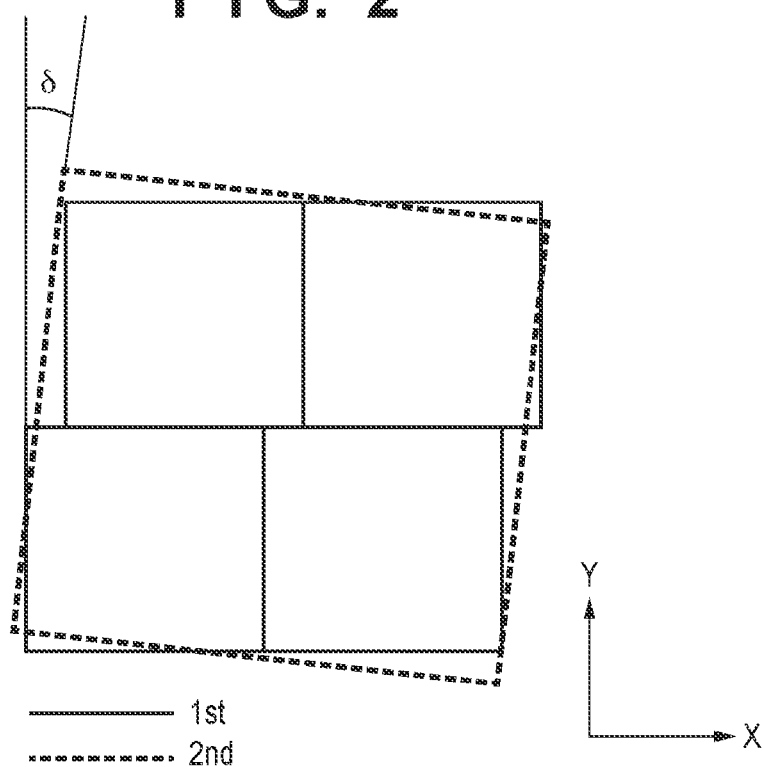
FIG. 2 is a view for explaining a conventional method of correcting an arrangement error of shot regions.
Figure 3:
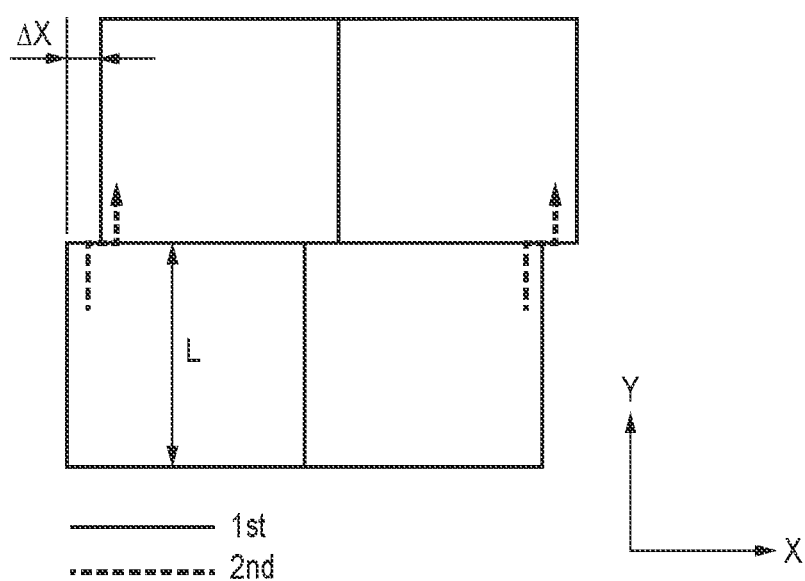
FIG. 3 is a view for explaining a conventional method of correcting an arrangement error of shot regions.
Figure 4:
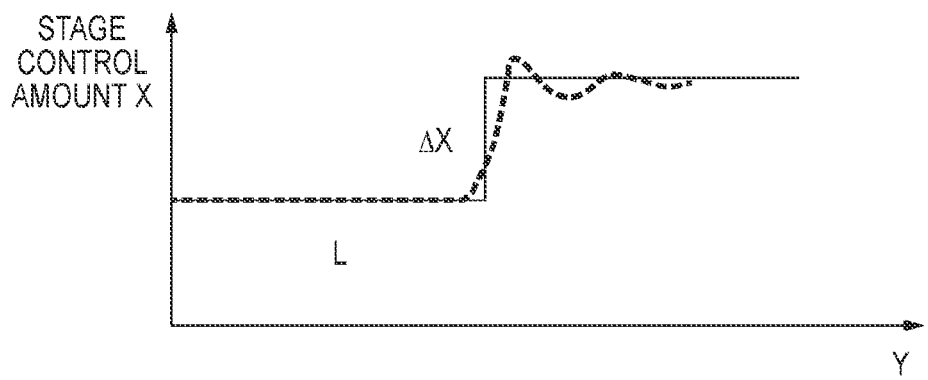
FIG. 4 is a view for explaining generation of an overlay error at the joint of shot regions.
Figure 5:
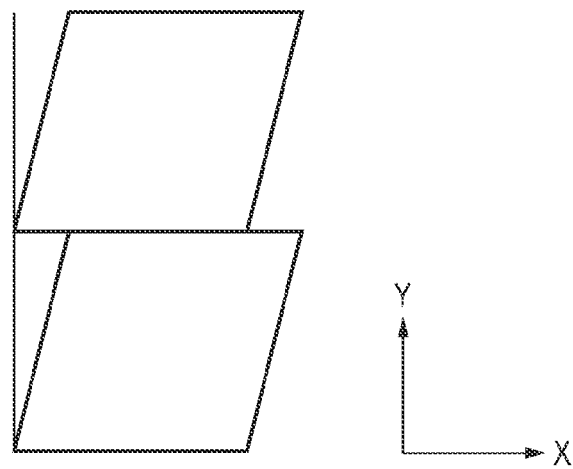
FIG. 5 is a view for explaining discontinuation of the joint between shot regions caused by a distortion of a shot region shape.

Conventionally, to correct an arrangement error in first exposure, an overlay error is reduced using "stage control during scan" in second exposure of the next layer. "Stage control during scan" means adjusting the relative position or relative angle between the original stage and the substrate stage in accordance with the exposure position in the scan direction. FIG. 2 is a view showing an example in which an arrangement error occurs in the X direction for a total of four shot regions formed by first exposure in which two shot regions are adjacent in each of the X and Y directions. To compensate for the arrangement error shown in FIG. 2 by second exposure, scan is performed by L, as shown in FIG. 3. After that, for example, the substrate stage is shifted by ΔX, and the remaining regions are then scanned. In actuality, however, the substrate stage control during scan is discontinuous at the joint between the shot regions, as shown in FIG. 4. For this reason, the control delays, and an overlay error occurs not only at the joint between the shot regions but also in other regions. When the scan speed is lowered, the control error of the substrate stage can be reduced. In this case, however, the throughput of the second exposure lowers. This problem can be solved by performing exposure to eliminate the arrangement error in the first exposure. However, for example, in a case in which the shot region shape is deformed from the ideal shape, as shown in FIG. 5, the joint between the shot regions is discontinuous even if there is no arrangement error.

According to this embodiment, when performing overlay exposure after the second exposure using shot regions including the joints of a plurality of shot regions, the overlay error can be reduced without lowering the throughput, as will be described below. In this embodiment, the exposure apparatus has a mode to expose an entire region formed from a plurality of region by exposing each of the plurality of regions such that the regions adjacent to each other are connected. In this mode, the main controller 101 evaluates the connection state of the regions adjacent to each other in the entire region exposed in accordance with control information (for example, shot layout information, projection magnification, scan direction, and the like) used to control the shape of the exposure region. The main controller 101 corrects the control information based on the evaluation so as to improve the connection state, thereby generating correction control information. The exposure unit exposes each of the plurality of regions in accordance with the correction control information generated in this mode, thereby exposing the entire region.

Figure 6:
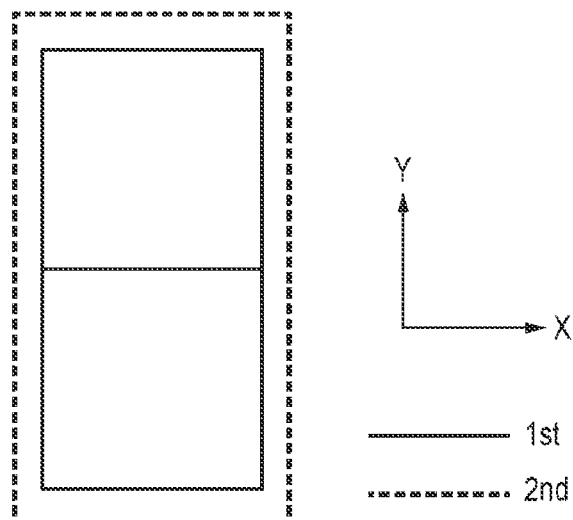
FIG. 6 is a view showing the relationship between first exposure and second exposure according to the embodiment.
Figure 7:
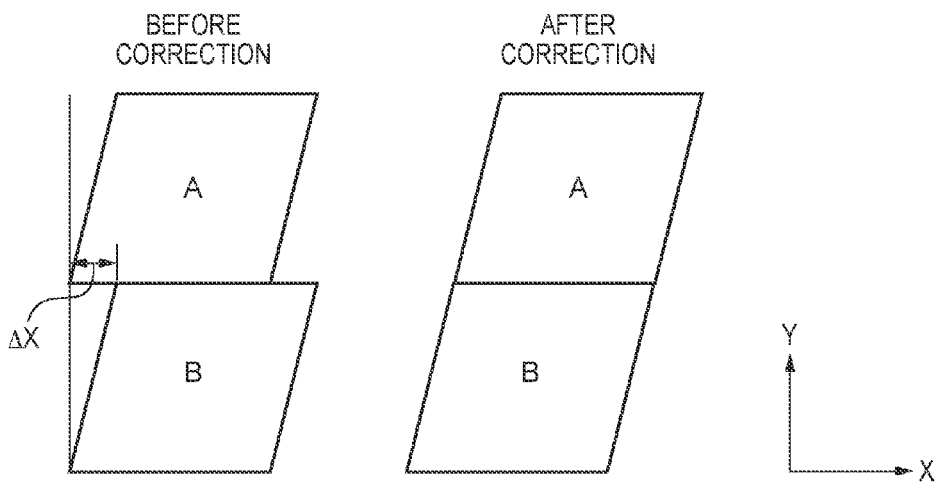
FIG. 7 is a view showing an example in which a continuous joint is formed using shot region shift in first exposure.

A case in which in this mode, second exposure is performed for two shot regions formed by first exposure to be adjacent to each other in the Y direction (scan direction) using a view angle including the two shot regions in the Y direction, as shown in FIG. 6, will be described as an example. FIG. 7 shows an example in which a continuous joint is formed using shot shift in first exposure. Assume that a shot region A (first shot region) and a shot region B (second shot region) which are rectangular regions are distorted into a parallelogrammic shape in the X direction. If there is no arrangement error, the shot region A and the shot region B have a positional relationship with a shift at the adjacent portion, as shown in the view of FIG. 7 before correction. More specifically, although the shot region A and the shot region B are in contact on sides, the apexes are shifted, and the joint is discontinuous. In this embodiment, to make the sides of the regions in contact match, the shot region A is shifted by a shift amount ΔX in the X direction perpendicular to the scan direction, thereby sequentially exposing the shot regions B and A in the first exposure (shot shift scan). The error at the joint between the two shot regions is thus reduced, and a continuous joint is formed, as shown in the view of FIG. 7 after correction. Hence, when performing second exposure, the stage need not be discontinuously driven during scan, and the overlay error can be reduced.

Figure 8:
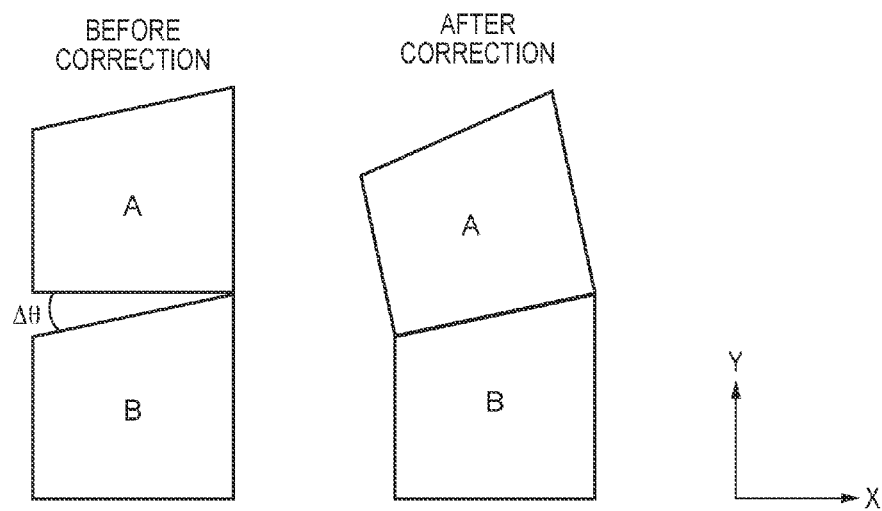
FIG. 8 is a view showing an example in which a continuous joint is formed using shot region rotation in first exposure.

FIG. 8 shows an example in which a continuous joint is formed using shot rotation in first exposure. Assume that the shapes of the shot regions are distorted as shown in FIG. 8. If there is no arrangement error, the shot region A and the shot region B have a positional relationship as shown in the view of FIG. 8 before correction. In this case, the joint between the shot region A and the shot region B is discontinuous. In this embodiment, to make the sides of the regions in contact match, the shot region A can be rotated by a rotation amount Δθ and exposed in the first exposure (shot rotation scan). The error at the joint between the two shot regions is thus reduced, and a continuous joint is formed, as shown in the view of FIG. 8 after correction. Hence, when performing second exposure, the stage need not be discontinuously driven during scan, and the overlay error can be reduced. In this case, the stage control during scan in the second exposure means rotating the relative relationship between the original and the substrate from the ideal state.

Figure 9:
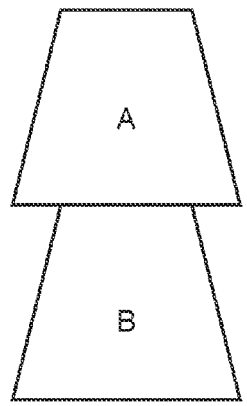
FIG. 9 is a view showing an example in which a continuous joint is formed using shot region magnification change in first exposure.
Figure 9:
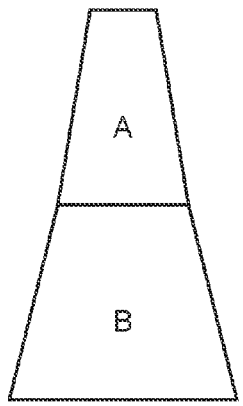
Figure 9:
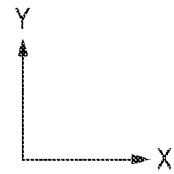

FIG. 9 shows an example in which a continuous joint is formed using shot magnification change in first exposure. Assume that the shot regions have shapes as shown in FIG. 9. If there is no arrangement error, the shot region A and the shot region B have a positional relationship as shown in the view of FIG. 9 before correction. In this case, the joint between the shot region A and the shot region B is discontinuous. In this embodiment, to make the sides of the regions in contact match, exposure can be performed by controlling the projection optical system to change the X-direction magnification of the shot region A (shot scaling scan). The error at the joint between the two shot regions is thus reduced, and a continuous joint is formed, as shown in the view of FIG. 9 after correction. Hence, when performing second exposure, the stage need not be discontinuously driven during scan, and the overlay error can be reduced. In this case, continuous drive in the second exposure can be implemented using a method of changing the exposure magnification of the projection optical system during scan, as described in, for example, Japanese Patent No. 3278303.

Figure 10:
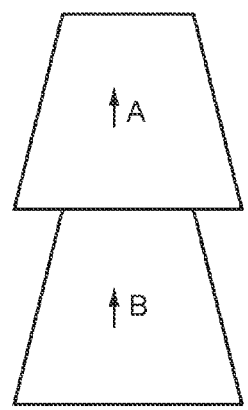
FIG. 10 is a view showing an example in which a continuous joint is formed by changing a scan direction in first exposure.
Figure 10:
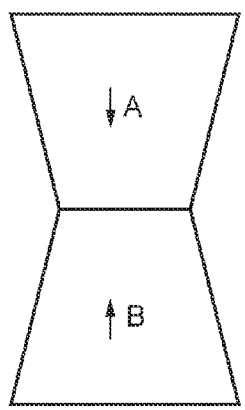
Figure 10:
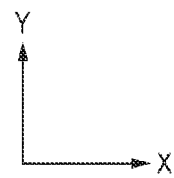

FIG. 10 shows an example in which a continuous joint is formed by changing the scan direction in first exposure. Consider a case in which the shot regions have shapes as shown in FIG. 10, and the shapes depend on the scan direction. If the shot region A and the shot region B are exposed in the same scan direction, and there is no arrangement error, the shot region A and the shot region B have a positional relationship as shown in the view of FIG. 10 before correction. In this case, the joint between the shot region A and the shot region B is discontinuous. In this embodiment, the scan direction of the shot region A can be reversed by changing the scan direction (reverse direction scan). The error at the joint between the two shot regions is thus reduced, and a continuous joint is formed, as shown in the view of FIG. 10 after correction. Hence, when performing second exposure, the stage need not be discontinuously driven during scan, and the overlay error can be reduced. In this case as well, continuous drive in the second exposure can be implemented using a method of changing the exposure magnification of the projection optical system during scan, as described in, for example, Japanese Patent No. 3278303.

In this case, to form a continuous joint between the shot region A and the shot region B, correction parameters include a parameter representing a scan direction change. Conditions to include the parameter representing a scan direction change in the correction parameters can be defined, for example, as follows.

Each of the shot regions A and B is distorted from a rectangular shape defined by control information (shot layout information) to a trapezoidal shape.

The lower base of the shot region A (first region) and the upper base of the shot region B (second region) overlap (the state before correction in FIG. 10), and the length difference between the upper base of the shot region A and the upper base of the shot region B is an allowed value or less. The allowed value can be set to a value with which the length difference between the upper bases of the shot regions can be regarded as substantially zero.

Examples in which correction scan such as shot shift scan, shot rotation scan, shot scaling scan, or reverse direction scan is performed at the time of exposure of the shot region A have been described above. However, the correction scan may be performed at the time of exposure of the shot region B or for both the shot region A and the shot region B. The correction parameters may instruct a combination of a plurality of corrections out of shot shift scan, shot rotation scan, shot scaling scan, and reverse direction scan. An example in which two shot regions are overlaid in the second exposure has been described above. However, even for three or more shot regions, a continuous joint can be formed in the first exposure by the same method as described above. The correction parameters used in the first exposure are decided based on, for example, a shot region shape obtained in advance by a test exposure such that a continuous joint is formed between the shot regions.

Figure 11:
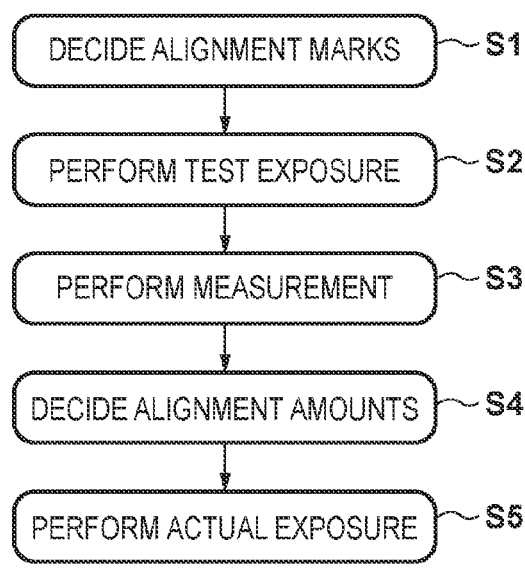
FIG. 11 is a flowchart showing the operation procedure of the exposure apparatus according to the embodiment.

FIG. 11 shows an operation procedure according to this embodiment. First, assuming that the shot region shape is ideal, alignment marks to be used are decided (step S1). Next, a test exposure for exposing a test substrate is executed using the decided alignment marks (step S2). The coordinates of the alignment marks are measured for each shot region in the test exposure (step S3). After that, an alignment amount used to form a continuous joint between the shot region A and the shot region B is decided based on the measurement result (step S4). Details of this processing will be described later. Then, actual exposure is executed using the decided new alignment marks (step S5).

Figure 12:
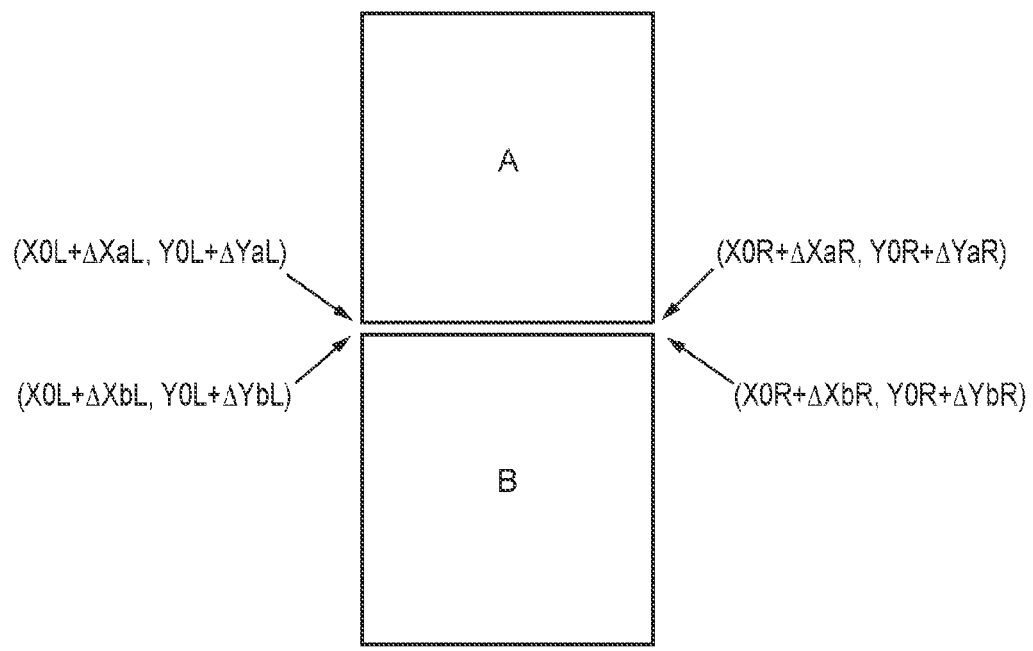
FIG. 12 is a view for explaining the coordinates of portions of interest of the joint between a shot region A and a shot region B.

How to obtain the correction parameters when performing shot shift, shot rotation, and shot magnification change of the shot region A to form a continuous joint between the shot region A and the shot region B will be described below. As shown in FIG. 12, points of interest on the joint between the shot regions are set to the lower right and lower left corners of the shot region A and the upper right and upper left corners of the shot region B. The coordinates of the ideal positions of these points are defined as (X0L, Y0L) and (X0R, Y0R). Coordinates (0, 0) indicate the center position of the shot region A. The coordinates of the points of interest of the shot regions in a case in which the joint is not continuous are defined as follows.

The lower left coordinates of the shot region A: (X0L+ΔXaL, Y0L+ΔYaL)

The lower right coordinates of the shot region A: (X0R+ΔXaR, Y0R+ΔYaR)

The upper left coordinates of the shot region B: (X0L+ΔXbL, Y0L+ΔYbL)

The upper right coordinates of the shot region B: (X0R+ΔXbR, Y0R+ΔYbR) where

ΔXaL is the X shift amount of the lower left coordinates of the shot region A in the test exposure, ΔYaL is the Y shift amount of the lower left coordinates of the shot region A in the test exposure, ΔXaR is the X shift amount of the lower right coordinates of the shot region A in the test exposure, ΔYaR is the Y shift amount of the lower right coordinates of the shot region A in the test exposure, ΔXbL is the X shift amount of the upper left coordinates of the shot region B in the test exposure, ΔYbL is the Y shift amount of the upper left coordinates of the shot region B in the test exposure, ΔXbR is the X shift amount of the upper right coordinates of the shot region B in the test exposure, and ΔYbR is the Y shift amount of the upper right coordinates of the shot region B in the test exposure Coordinates in a case in which the parameters are changed for the shot region A are defined as follows.

The lower left coordinates of the shot region A: (X0L+ΔXaL', Y0L+ΔYaL')

The lower right coordinates of the shot region A: (X0R+ΔXaR', Y0R+ΔYaR')

From the above definition, we obtain $$\Delta XaL' = \Delta XaL + Sx + X0L^*\cos\theta - Y0L^*\sin\theta + X0L^*Mx \quad (1)$$

$$\Delta YaL' = \Delta YaL + Sy + X0L^*\sin\theta + Y0L^*\cos\theta \quad (2)$$

$$\Delta XaR' = \Delta XaR + Sx + X0R^*\cos\theta - Y0R^*\sin\theta + X0R^*Mx \quad (3)$$

$$\Delta YaR' = \Delta YaR + Sy + X0R^*\sin\theta + Y0R^*\cos\theta \quad (4)$$

where

Sx is the amount to change the shot region A in the X direction

Sy is the amount to change the shot region A in the Y direction

θ is the amount to rotate the shot region A about

Mx is the magnification to change the shot region A in the X direction

Conditions to form a continuous joint are as follows.

$$\Delta XaL' = \Delta XbL \quad (5)$$

$$\Delta YaL = \Delta YbL \quad (6)$$

$$\Delta XaR' = \Delta XbR \quad (7)$$

$$\Delta YaR = \Delta YbR \quad (8)$$

Sx, Sy, e, and Mx are obtained by transforming above expressions and solving $$\Delta XbL = \Delta XaL + Sx + X0L^* \cos\theta - Y0L^* \sin\theta + X0L^* Mx \quad (9)$$

$$\Delta YbL = \Delta YaL + Sy + X0L^* \sin\theta + Y0L^* \cos\theta \quad (10)$$

$$\Delta XbR = \Delta XaR + Sx + X0R^* \cos\theta - Y0R^* \sin\theta + X0R^* Mx \quad (11)$$

$$\Delta YbR = \Delta YaR + Sy + X0R^* \sin\theta + Y0R^* \cos\theta \quad (12)$$

Figures 13, 14:
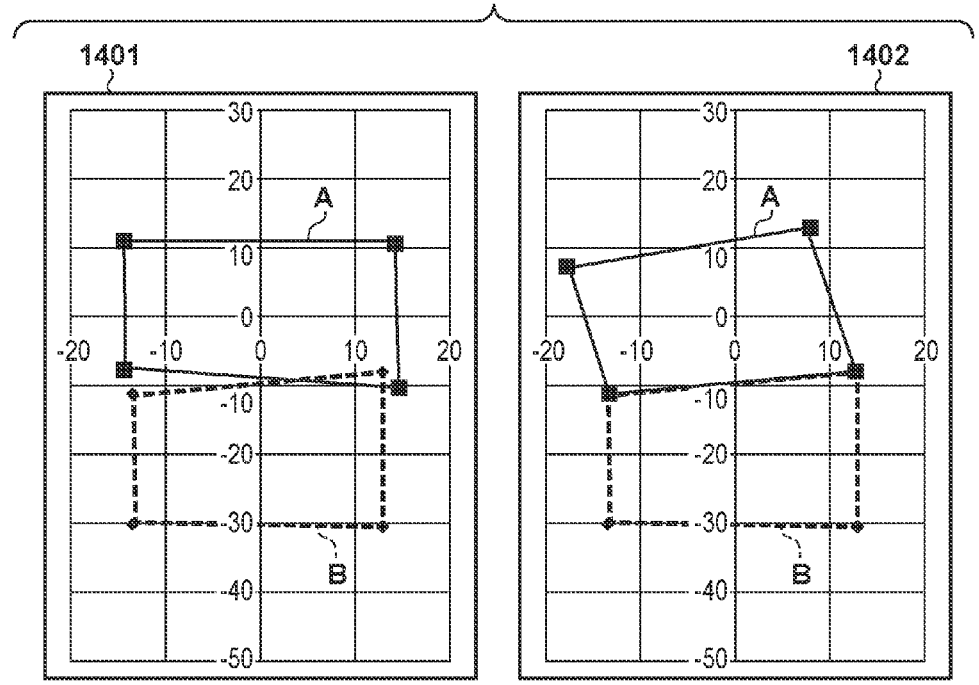
FIG. 13 is a view showing an example of the initial coordinate values of the shot regions A and B.
FIG. 14 is a view showing an example of the relationship of the shot regions A and B before and after adjustment of the joint.

An example of parameter calculation using the above expressions will be described. Both the shot region A and the shot region B have a shot region size of X=26 mm and Y=20 mm. The initial coordinate values for the shot regions A and B are set as shown in FIG. 13. Coordinates (X, Y)=(0, 0) indicate the center of the shot region A. Referring to FIG. 13, ΔX and ΔY indicate shift amounts from ideal coordinates.

The parameters used to adjust the joint are calculated by the above-described method as Sx=−7.92 nm
Sy=−2.00 nm
θ=0.69 μrad
Mx=−0.31 ppm FIG. 14 shows the relationship of the shot regions A and B before and after adjustment of the joint in this case. A solid line indicates the shot region A, and a broken line indicates the shot region B. A state 1401 is a state before adjustment of the joint, and a state 1402 is a state after adjustment of the joint. Note that in FIG. 14, the plotted coordinate shifts are enhanced to clearly show the relationship of the shot regions.

In the above example, since the four parameters Sx, Sy, θ, and Mx are obtained for two points of interest (four points as X- and Y-coordinates) of the joint, the parameters are obtained by solving simultaneous equations. If the number of points of interest is larger than the number of parameters to be obtained, the parameters can be obtained by least square fitting.

<Embodiment of Article Manufacturing Method>

An article manufacturing method according to the embodiment of the present invention is suitable for manufacturing an article, for example, a microdevice such as a semiconductor device or an element having a fine structure. The article manufacturing method according to this embodiment includes a step of forming, using the above-described exposure apparatus, a latent image pattern on a photoresist applied to a substrate (a step of exposing a substrate), and a step of developing the substrate with the latent image pattern formed in the above step. The manufacturing method also includes other known steps (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-224228, filed Nov. 16, 2015, which is hereby incorporated by reference herein in its entirety.

What is claimed is:

1. An exposure apparatus for exposing each of a plurality of shot regions on a substrate, the plurality of shot regions including two shot regions arranged adjacent to each other such that edges thereof contact each other, the apparatus comprising a control unit configured to control exposure processing of exposing each of the plurality of shot regions on the substrate using control information for controlling shapes of the shot regions exposed on the substrate such that the two shot regions are adjacent to each other, wherein the control information includes correction information for correcting, based on layout information of the plurality of shot regions, a deviation of adjacent portions of the two shot regions caused by a distortion of the shapes of the two shot regions when exposing each of the two shot regions, and wherein the correction information includes information of a correction factor for at least one of the two shot regions for matching sides where the two shot regions adjacent to each other are in contact, and the control unit controls the exposure processing using the correction information.

2. The apparatus according to claim 1, wherein the correction information is obtained based on a result of measuring coordinates of an alignment mark formed when the two shot regions are exposed on a substrate in accordance with the layout information.

3. The apparatus according to claim 1, wherein the correction information includes information for shifting a position of the at least one of the two shot regions so as to match sides where the two shot regions are in contact.

4. The apparatus according to claim 1, wherein the correction information includes information for rotating the at least one of the two shot regions so as to match sides where the two shot regions are in contact.

5. The apparatus according to claim 1, wherein the correction information includes information for changing a magnification of the at least one of the two shot regions so as to match sides where the two shot regions are in contact.

6. The apparatus according to claim 1, wherein the correction information includes information for reversing a scan direction of an exposure region in exposure of each of the two shot regions so as to match sides where the two shot regions are in contact.

7. The apparatus according to claim 1, wherein after the exposure processing is performed using the correction information, the control unit is configured to of set two shot regions adjacent to each other formed on the substrate to one shot region, and perform exposure processing of exposing the set shot region by superposing a pattern on the two shot regions.

8. The apparatus according to claim 1, wherein the correction information includes information for reducing discontinuity of the adjacent portions of the two shot regions.

9. An article manufacturing method comprising:
exposing a substrate using an exposure apparatus; and
developing the exposed substrate,
wherein the exposure apparatus is an exposure apparatus for exposing each of a plurality of shot regions on the substrate, the plurality of shot regions including two shot regions arranged adjacent to each other such that edges thereof contact each other, the apparatus comprising a control unit configured to control exposure processing of exposing each of the plurality of shot regions on the substrate using control information for controlling shapes of the shot regions exposed on the substrate such that the two shot regions are adjacent to each other,
wherein the control information includes correction information for correcting, based on layout information of the plurality of shot regions, a deviation of adjacent portions of the two shot regions caused by a distortion of the shapes of the two shot regions when exposing each of the two shot regions, and
wherein the correction information includes information of a correction factor for at least one of the two shot regions for matching sides where the two shot regions adjacent to each other are in contact, and
the control unit controls the exposure processing using the correction information.

\* \* \* \* \*